(12) United States Patent
Schmid et al.

(10) Patent No.: US 11,452,227 B2
(45) Date of Patent: Sep. 20, 2022

(54) POWER PHASE MODULE OF A CONVERTER, CONVERTER, AND VEHICLE

(71) Applicant: Bombardier Transportation GmbH, Berlin (DE)

(72) Inventors: Roland Schmid, Zurich (CH); Stefan Lagger, Effretikon (CH); Reinhard Reichelt, Kuessaberg (DE); Klaus Schwichtenberg, Wutoeschingen (DE); Adrian Laudan, Buchs ZH (CH)

(73) Assignee: Bombardier Transportation GmbH, Berlin (DE)

( * ) Notice: Subject to any disclaimer, the term of this patent is extended or adjusted under 35 U.S.C. 154(b) by 333 days.

(21) Appl. No.: 16/617,603

(22) PCT Filed: Jun. 1, 2018

(86) PCT No.: PCT/EP2018/064536
§ 371 (c)(1),
(2) Date: May 1, 2020

(87) PCT Pub. No.: WO2018/220214
PCT Pub. Date: Dec. 6, 2018

(65) Prior Publication Data
US 2020/0281087 A1    Sep. 3, 2020

(30) Foreign Application Priority Data
Jun. 2, 2017   (DE) ..................... 10 2017 209 454.0

(51) Int. Cl.
*H05K 7/14*    (2006.01)
*H01G 4/38*    (2006.01)
(Continued)

(52) U.S. Cl.
CPC ............. *H05K 7/1432* (2013.01); *H01G 4/38* (2013.01); *H01G 4/40* (2013.01); *H01L 23/50* (2013.01); *H02M 7/003* (2013.01); *H05K 7/2089* (2013.01)

(58) Field of Classification Search
CPC .... B61C 3/00; B60L 2210/40; B60L 2200/26; B60L 50/16; B60L 50/51; B60L 50/64;
(Continued)

(56) References Cited

U.S. PATENT DOCUMENTS

| 4,992,925 A | 2/1991 | Meyer |
| 5,245,527 A | 9/1993 | Duff et al. |

(Continued)

FOREIGN PATENT DOCUMENTS

| DE | 3802593 A1 | 8/1989 |
| DE | 69209093 T2 | 10/1996 |

(Continued)

OTHER PUBLICATIONS

Bordline CC750 AC_15-25kV, ABB Switzerland Ltd, Feb. 19, 2018, Retrieved from abb.com/railway, 2 pages.

*Primary Examiner* — Krystal Robinson
(74) *Attorney, Agent, or Firm* — The Webb Law Firm

(57) ABSTRACT

A power phase module has at least one first DC terminal pair on a face of the power phase module with respective connection elements for connection to a current bar pair. The power phase module further has a first DC capacitor terminal pair on the face being spaced apart from the first DC terminal pair and connected in parallel with it and having respective connection elements for connection to an intermediate circuit capacitor module associated with the power phase module. The power phase module further has a first AC terminal on another side of the power phase module and a switching device connected with the first AC terminal and (Continued)

the first DC terminal pair for converting a direct voltage. The power phase module further has a cooling device to carry heat out of the power phase module. Further proposed are a converter and a rail vehicle with a converter.

15 Claims, 8 Drawing Sheets

(51) Int. Cl.
  *H01G 4/40* (2006.01)
  *H01L 23/50* (2006.01)
  *H02M 7/00* (2006.01)
  *H05K 7/20* (2006.01)

(58) Field of Classification Search
  CPC .......... B60L 50/50; B60L 53/20; B60L 53/22; B60L 3/003; B60L 50/60; B60L 53/14; B60L 15/007; B60L 15/2009; B60L 2210/10; B60L 2210/20; B60L 2220/14; B60L 2240/423; B60L 2240/443; B60L 2240/525; B60L 2240/527; B60L 2240/529; B60L 2240/545; B60L 2240/547; B60L 2240/549; B60L 3/0069; B60L 50/61; B60L 7/14; B60L 9/18; H01G 4/40; H01G 4/38; H01G 2/103; H01G 4/005; H01G 4/224; H01G 4/228; H01G 4/236; H02M 7/003; H02M 1/327; H02M 7/537; H02M 7/44; H02M 7/5395; H02M 7/48; H02M 7/5387; H02M 1/0048; H02M 1/0058; H02M 1/08; H02M 1/34; H02M 1/342; H02M 1/346; H02M 1/44; H02M 7/68; H02M 7/797; H02M 1/14; H02M 1/32
  See application file for complete search history.

(56) References Cited

U.S. PATENT DOCUMENTS

| | | | |
|---|---|---|---|
| 2002/0126465 A1* | 9/2002 | Maly | H05K 1/0231 361/818 |
| 2007/0246636 A1* | 10/2007 | Katayama | B60L 50/15 248/637 |
| 2008/0130223 A1* | 6/2008 | Nakamura | H02M 7/003 361/689 |
| 2009/0040724 A1* | 2/2009 | Nishikimi | H05K 7/20927 361/699 |
| 2011/0198919 A1* | 8/2011 | Hattori | B60L 53/20 307/9.1 |
| 2016/0128216 A1 | 5/2016 | Harada et al. | |
| 2016/0247793 A1 | 8/2016 | Ohno | |

FOREIGN PATENT DOCUMENTS

| | | |
|---|---|---|
| DE | 102015118591 A1 | 5/2016 |
| DE | 102016102305 A1 | 8/2016 |
| EP | 2562922 A1 | 2/2013 |
| JP | 200565412 A | 3/2005 |

* cited by examiner

POWER PHASE MODULE OF A CONVERTER, CONVERTER, AND VEHICLE

CROSS-REFERENCE TO RELATED APPLICATIONS

This application is the United States national phase of International Application No. PCT/EP2018/064536 filed Jun. 1, 2018, and claims priority to German Patent Application No. 10 2017 209 454.0 filed Jun. 2, 2017, the disclosures of which are hereby incorporated by reference in their entirety.

TECHNICAL FIELD

Background of the Invention

The invention is in the field of power electronics, in particular that of power converters, and it relates to the construction of a phase module for power converters and a converter. The invention also relates to a vehicle with a converter.

Prior Art

Converters serve to convert alternating voltage and alternating current, this conversion involving adapting the characteristic properties such as voltage amplitude and frequency. A converter can have an intermediate circuit. It serves as a temporary storage and as an electrical buffer. Voltage and current are both converted in power converters.

Converters are used, for example, for drives of variable-speed electric motors. These are found in vehicles, especially in rail vehicles such as streetcars, metros, electric locomotives, or high-speed trains. The vehicle taps the voltage through an overhead contact wire or a third rail, for example. This voltage is then adapted in the converter for the electrical drive.

Electric motors are used in the same way as dynamos to produce electric current from kinetic energy, for example as an electric vehicle is braking. The converter typically acts in both directions.

Converters can have phase modules with controllable semiconductor devices, for example IGBTs (insulated-gate bipolar transistors). By means of a frequented control, a phase current is generated in the phase module. This phase current can then drive an electric motor, for example.

Power converters in rail vehicles consist of large arrangements of power converter units, wherein each power converter unit is connected to the intermediate circuit. Long connections to the intermediate circuit produce high inductance and, in connection with this, a power loss.

The objective of the invention is to improve the construction of the converter.

This objective is achieved by a power phase module for a modular converter. This goal is further achieved by a converter and a vehicle, in particular a rail vehicle.

What is proposed is a power phase module for a modular converter. The power phase module has at least one first DC terminal pair on a face of the power phase module with respective connection elements for connection to a current bar pair; a first DC capacitor terminal pair on the face, this DC capacitor terminal pair being spaced apart from the first DC terminal pair and connected in parallel with it and having respective connection elements for connection to an intermediate circuit capacitor module associated with the power phase module; a first AC terminal on another side of the power phase module; a switching device connected with the first AC terminal and the first DC terminal pair to convert a direct voltage, which is present across the first DC terminal pair in an operating state, into an alternating voltage produced at the first AC terminal, or vice versa; and a cooling device to carry heat from the power phase module away, in particular out of the switching device.

The power phase module can be used to convert direct current into alternating current or alternating current into direct current in a modularly structured converter. In the converter, multiple power phase modules can be operated in parallel, independently of one another, or in an interdependent manner. The power phase modules are compactly structured and can be arranged next to one another in a space-saving manner in the modular converter. The power phase module is advantageously replaceable.

The power phase module has a face. It can, for example, have approximately the shape of a cuboid with large and small lateral faces. The face is a side with a small surface. On this face, the power phase module has at least one first DC terminal pair. This DC terminal pair allows a current bar pair to be connected on the face of the power phase module. The power phase module is supplied with a direct voltage through the DC terminal pair when the current bars are connected, or it can supply a direct voltage.

The first DC terminal pair is designed for direct voltage and can have two connection elements, which are in the form of two terminals with corresponding contact elements. According to one embodiment, the two terminals of the first DC terminal pair are at different potentials during an operating state of the power phase module, so that a direct voltage is present across them. The terminals of the DC terminal pair are arranged with respect to one another and are electrically insulated so that no current can flow between them in a normal operating state. The insulation between the terminals can be, for example, air. It is also possible for the terminals to be electrically insulated by a coating.

Furthermore, the power phase module has, on its face, a first DC capacitor terminal pair that is spaced apart from the first DC terminal pair and is connected in parallel with it. The first DC capacitor terminal pair can have an intermediate circuit capacitor module connected to it, this intermediate circuit capacitor module being associated with the power phase module. To accomplish this, the connection elements of the first DC capacitor terminal pair can be connected with terminals of the intermediate circuit capacitor module. The connection between the DC capacitor terminal pair and the intermediate circuit capacitor module is, in particular, detachable, for example the connection elements are in the form of drill holes and the terminals of the intermediate circuit capacitor module have screws or current carrying bolts as corresponding contact elements.

According to one embodiment, the first DC capacitor terminal pair has two terminals, which are at different potentials during an operating state of the power phase module and have a direct voltage across them. The two terminals are electrically insulated from one another and are spaced apart from one another. They can be close together, in particular, they can be arranged so that no other current-carrying conductor is arranged between the two terminals of the DC capacitor terminal pair.

According to one embodiment, the first DC terminal pair has two terminals, which are at different potentials during an operating state of the power phase module and have a direct voltage across them. The terminals can lie spatially close to one another on the face.

Intermediate circuits of converters usually have electrical capacitors incorporated into them. At high currents or high power densities of the converter, high current carrying capacity with simultaneously low self-inductance of the intermediate circuit capacitor can be advantageous for efficiency. Low equivalent series resistance (ESR) and low equivalent series inductance (ESL) are requirements for good efficiency. A low-inductance connection of the intermediate circuit capacitor to the switching device can also lead to an increase in efficiency. A low-inductance connection can also relieve the load on the semiconductor due to switching voltages and switching currents.

The inductance of the connection of the switching devices to the capacitor is determined by the length of the electric line or the size of the conductor loop, among other things. The bigger the conductor loop, the higher the inductance. Therefore, the intermediate circuit capacitor should be placed as close as possible to the switching device. According to one embodiment, the first DC capacitor terminal pair on the face is designed in such a way that an intermediate circuit capacitor module can be connected essentially directly to the first DC capacitor terminal pair. That is, the intermediate circuit capacitor module can be arranged spatially as close as possible to the power phase module.

To accomplish this, the power phase module is arranged so that the face of the power phase module is directly opposite the intermediate circuit capacitor module. In particular, the intermediate circuit capacitor module has at least one surface that has electrical contact elements arranged on it for connection of the DC capacitor terminal pair to the intermediate circuit capacitor module. The electrical contact elements are preferably arranged exclusively on a surface of the intermediate circuit capacitor module. The power phase module is arranged in such a way that the first side of the power phase module lies opposite the one surface of the intermediate circuit capacitor module. That is, the face of the power phase module is arranged on an intermediate circuit capacitor module that is associated with this power phase module. This advantageously creates a very short and low-inductance connection situation between the intermediate circuit capacitor and the switching device. The also comprises connection elements, in particular detachable connection elements, between the DC capacitor terminal pair and the intermediate circuit capacitor module. The connection elements can comprise both mechanical fasteners and also electrically conductive connections. The connection elements are, for example, screw connections.

The intermediate circuit capacitor module has at least one capacitor. The capacitor acts as an intermediate circuit capacitor of the power phase module. During a switching operation of the switching device, the current in the capacitor changes. Therefore, it is part of the commutation circuit. The intermediate circuit capacitor is also referred to as a commutation capacitor.

The power phase module has a first AC terminal on a side other than the face. Through this first AC terminal, the power phase module is supplied with an alternating voltage, or it can supply an alternating voltage. This other side can lie opposite the face and can itself be another face.

Furthermore, the power phase module has a switching device. The switching device is connected with the first AC terminal and the first DC terminal pair. The switching device is capable of converting a direct voltage, which is present across the first DC terminal pair in an operating state, into an alternating voltage produced at the first AC terminal, or vice versa. That is, the switching device is electrically connected between the first DC terminal pair and the first AC terminal.

According to one embodiment, the switching device is not only electrically connected between the first DC terminal pair and the first AC terminal, but rather also spatially arranged between them. There can be overlap areas. One objective of the invention is, among others, to minimize the inductance. This can be done by minimizing the size and length of conductor loops. Therefore, a compact spatial arrangement is useful.

According to one embodiment, in an operating state of the power phase module a direct voltage is present across the first DC terminal pair. The connection of the first DC terminal pair with the switching device allows a current to flow through the switching device, on through the connection with the first AC terminal, to this first AC terminal. Depending on the switching device, the latter can be operated so as to produce an alternating voltage at the first AC terminal.

According to one embodiment, the switching device has at least one of the following electronic components: a diode, a power MOSFET, and an IGBT. In particular, circuits consisting of multiple diode or IGBT half bridges or full bridges, or combinations of them, can also be part of the switching device.

According to one embodiment, the one or more switching devices of the power phase module has/have in each case at least one diode half bridge or one IGBT half bridge.

According to one embodiment, as direct voltage is converted into alternating voltage the switching device generates a frequency, or specifies a frequency, with which the direct current is converted into an alternating current having just this frequency. To accomplish this, the switching device can have a controller, in particular a gate controller, or it can be connected with a controller.

According to one embodiment, the power phase module has at least one controller to control the switching device. The controller is advantageously arranged on the other face, that is the face of the AC terminals.

According to one embodiment, the power phase module, in particular the switching device, has one or more terminals of a controller to control the one or more switching devices. The control can be performed through electrical signals, carried over copper wires, for example, or through optical signals, carried over optical fibers, for example.

According to one embodiment, the power phase module has another switching device, or multiple additional switching devices. Two or more switching devices can be connected to the same AC terminal, if their frequencies and phases are compatible. However, it is also possible for every switching device to be connected to a separate AC terminal, and then the power phase module has further AC terminals.

According to one embodiment, multiple switching devices can be connected in parallel with one another between the first DC terminal pair and the AC terminal(s). If there are multiple DC terminal pairs, the switching devices can be connected in parallel with one another between the DC terminal pairs and the AC terminal(s).

According to one embodiment, the power phase module also has a power supply connection to supply gate drivers of the switching device. The gate drivers can vary with different embodiments of the switching devices, that is, the semiconductor components and their circuits. For example, a power supply connection can have a voltage of 24V or 110V connected to it during an operating state. These voltages correspond to typical voltages in a rail vehicle, which are generated by the vehicle battery, for example.

According to one embodiment, a switching device has one or more switching modules, in particular one dual switching module or two single switching modules. If the switching module is a dual switching module, it is connected with both the first and the second terminal of the DC terminal pair. In the case of switching modules, each single switching module is connected with only one terminal of the DC terminal pair.

A dual switching module can electrically correspond to a full-wave rectifier. It takes advantage of both potentials of the DC terminal pair and converts it into an alternating voltage by a corresponding control. In electrical terms, a single switching module can be considered to be a half-wave rectifier. It takes advantage of only one potential of the DC terminal pair. In electrical terms, two single switching modules form a full-wave rectifier.

According to one embodiment, the voltage class of the switching devices, in particular of the entire power phase module, is approximately 1,200V to approximately 6,500V.

According to one embodiment, an electric current that flows from a DC terminal pair to an AC terminal through a switching device in an operating state is at least 300 A (dual switch) or at least 800 A (single switch).

According to one embodiment, the one or more switching devices are controlled so that they produce, from the direct voltage that is present, an alternating voltage at their AC terminal. The controller of the switching device can be, in particular, a gate controller if the switching devices have controllable semiconductor components with gates, in particular IGBTs.

According to one embodiment, the power phase module has a gate controller. The gate controller is connected with the switching device and is set up to control the switching device so that a direct voltage being present on the switching device is converted into an alternating voltage, or vice versa.

According to one embodiment, the switching device has two single switching modules, each with a diode, these diodes being anti-parallel to one another. In this embodiment, the resulting half bridge is a passive circuit. Two of these half bridges form an uncontrolled rectifier.

According to another embodiment, the switching device has one dual switching module. The dual switching module has a half bridge with switches and anti-parallel diode; or the dual switching module has a half bridge rectifier with diodes.

According to another embodiment, the switching device has one dual switching module with a chopper half bridge with a semiconductor switch and anti-parallel diode and a diode. Semiconductor switches, in particular IGBTs, and the associated anti-parallel diode can also be integrated on a chip. This also applies to a power MOSFET, whose antiparallel diode is monolithically integrated.

According to one embodiment, the power phase module has 1 to 6 switching modules (single or dual switching modules).

The power phase module can have other AC terminals in additional to the first AC terminal. According to one embodiment, the power phase module has 1 to 6 AC terminals. Different embodiments of switching devices can be incorporated into a power phase module and associated with the AC terminals. The power phase module can have 1 to 6 switching devices.

An AC terminal of the power phase module can be used as load connection for the phase connection of an electric motor, for example. The current flows from one terminal of the DC terminal pair, through the switching device, and on through the AC terminal, to the electric motor. Conversely, the AC terminal can be used by a regenerative brake to feed alternating current through a generator as an electric vehicle is braking, for example. The current is produced in the generator and flows through the AC terminal, and on through the switching device into the DC terminal pair. A connected capacitor in an intermediate circuit capacitor module serves as a temporary energy storage and as an electrical buffer during the conversion.

Furthermore, the power phase module has a cooling device to carry heat from the power phase module away, in particular out of the switching device. In an operating state, the ohmic resistance of the current-carrying components of the power phase module produces heat. In particular, in the switching device(s), electrical energy is converted into parasitic heat. As a rule, rising temperatures lowers the efficiency of the components. The cooling device protects the power phase module from destruction due to heat, and cools it down to an efficient operating temperature.

According to one embodiment, the cooling device is in the form of a cold plate. The switching device can be arranged on the cold plate in such a way that the heat produced in the switching devices can be carried away by the cooling device. The cold plate can be in the form of mechanical supports of the switching devices.

According to one embodiment, the cooling device has a coolant. The coolant can be a gas or a liquid, in particular essentially water or air. The person skilled in the art can adapt the coolant in accordance with commonly used cooling devices for comparable electronic subassemblies.

According to one embodiment, the cooling device has hydraulic connections to carry coolant into and out of the cooling device. The hydraulic connections can be connected to a coolant system. For example, the hydraulic connections can be in the form of quick-connect couplings that can be connected with a coolant system by being pushed onto corresponding connections of a coolant system.

According to one embodiment, the power phase module has approximately the shape of a cuboid with large-area and small-area sides. The face is a side with a small surface. The switching devices, in particular the single or dual switching modules of the switching devices, are arranged next to one another in a plane perpendicular to the face. The cooling device is connected with the switching device or the switching modules in such a way that the coolant flowing in the cooling device carries heat that is produced away, out of the switching device or the switching modules. For example, the cooling device can partly enclose the switching devices or the switching modules, or the cooling device can be in the form of a plate-shaped element on which the switching devices or the switching modules are arranged and connected in a thermally conductive way.

According to one embodiment, the switching device of the power phase module is replaceable. This means that the switching device is detachably connected with the other components in the power phase module in a such way that it can be removed without destroying other components of the power phase module. To accomplish this, the switching device is detachably fastened, for example by detachable fasteners such as screws.

According to one embodiment, the first DC terminal pair and the first DC capacitor terminal pair are formed from sheet metal areas bent away from cross bridges and these sheet metal areas are arranged essentially in a plane. The respective connection elements of the first DC terminal pair and of the first DC capacitor terminal pair can be formed on or in the bent sheet metal areas.

According to one embodiment, the first terminal of the first DC terminal pair and that of the first DC capacitor terminal pair are formed from a piece of sheet metal, in particular a single piece of sheet metal. The terminals can have connection elements, for example drill holes for fasteners. The same can apply analogously for the second terminals of the first DC terminal pair and of the first DC capacitor terminal pair, it being possible for each of the terminals to be independent of one another and differently shaped.

According to one embodiment, the separation of the two terminals of the DC capacitor terminal pair is different from that of the two terminals of the first DC terminal pair. The terminals of the DC capacitor terminal pair are provided for connection to an intermediate circuit capacitor module or an intermediate circuit capacitor. The two terminals of the first DC terminal pair are provided for connection to current bars. The separation of two current bars can differ from that of two intermediate circuit capacitor terminals.

According to one embodiment, the separation of the connection elements of the first and/or of the second DC capacitor terminal pair is different from that of the connection elements of the first and/or of the second DC terminal pair.

According to this embodiment, the terminals of the first DC terminal pair can be connected to current bars and the terminals of the first DC capacitor terminal pair can be connected to an intermediate circuit capacitor module, the current bars and the intermediate circuit capacitor module being arranged in the same way essentially in a plane. The spatially close connection of the intermediate circuit capacitor module to the DC capacitor terminal pair reduces the resulting geometric size of the conductor loop, thereby also reducing the inductance of the intermediate circuit.

According to this embodiment, each power phase module is associated with exactly one intermediate circuit capacitor module, and the intermediate circuit capacitor module has at least one capacitor. Typical capacitances of the intermediate circuit capacitor module lie in the range from a few hundred microfarads to more than 1,000 microfarads, and can be selected depending on the voltage in the intermediate circuit. For example, the capacitance can be 400 µF for 3.6 kV, 700 µF for 2.8 kV, 1,600 µF for 1.8 kV, or 9,000 µF for 750V. These discreet values only result from the typical target values in the manufacture of capacitors, and the values are not limited to them. The total capacitance is determined by one or more parallel capacitors in the intermediate circuit capacitor module.

According to one embodiment, the terminals of the intermediate circuit capacitor module to be connected are in the form of blade contacts. In an operating state, each of multiple mechanical blade contacts, which can be combined into two contact groups, can be at a first or a second potential. Alternatively, the intermediate circuit capacitor module can also have only a single blade contact pair. The number of DC capacitor terminal pairs is adapted to the contacts of the intermediate circuit capacitor module. Every contact group can have, for example, three blade contacts with corresponding connection elements. In addition to the first DC capacitor terminal pair, the power phase module then has two other DC capacitor terminal pairs, so that all six terminals of the DC capacitor terminal pairs are connectable with the, in each case, three blade contacts.

According to one embodiment, the power phase module also has a second DC capacitor terminal pair and possibly a third DC capacitor terminal pair, the first DC capacitor terminal pair and the second DC capacitor terminal pair and possibly the third DC capacitor terminal pair being detachably connectable with an intermediate circuit capacitor module with four terminals or six terminals, respectively. To accomplish this, the additional DC capacitor terminal pairs can also have connection elements. Alternatively, the power phase module can also have two DC capacitor terminal pairs, two terminals of each DC capacitor terminal pair being combined into and in the form of a common terminal. The common terminal is advantageously designed so that it has electrically analogous properties, in particular essentially the same impedance, as the sum of the other two terminals.

According to one embodiment, the power phase module has a second DC capacitor terminal pair that is arranged on the face of the power phase module, spaced apart from each first DC terminal pair and the first DC capacitor terminal pair, and connected in parallel.

According to one embodiment, the first or the first and the second DC capacitor terminal pairs are designed for detachable connection with corresponding contact elements of an intermediate circuit capacitor module that can be placed on the face.

According to one embodiment, an intermediate circuit capacitor module has at least one capacitor and two or more terminals. The capacitor is connected between the two terminals. The intermediate circuit capacitor module can also have multiple parallel capacitors or capacitors that are connected in parallel through the connection with the power phase module.

According to one embodiment, the power phase module also has a second DC terminal pair that is arranged on the face of the power phase module, spaced apart from each of the first DC terminal pair and the first DC capacitor terminal pair, and connected in parallel. The second DC terminal pair can also have two connection elements on two terminals that are at different potentials in an operating state.

According to this embodiment, the terminals of the two DC terminal pairs can be designed in each case spatially close to one another to connect to each of two current bar pairs, sections of which run in parallel. Guiding the two current directions spatially close minimizes the sizes of conductor loops and reduces the inductance. This has a positive effect on efficiency.

According to one embodiment, the first DC capacitor terminal pair or the first and the second DC capacitor terminal pairs are arranged in a row between the first DC terminal pair and the second DC terminal pair. This allows an intermediate circuit capacitor module to be arranged between two current bar pairs. This reduces the distance from the intermediate circuit capacitor to the switching device, thereby reducing the inductance. Then, the connections of the DC terminal pair are spatially close to one another, so that two conductors with opposite current directions are always arranged spatially close together. This reduces the sizes of the conductor loops.

According to this embodiment, a connected intermediate circuit capacitor module is arranged between the two DC terminal pairs and is connected to the DC capacitor terminal pair. The two DC terminal pairs always have two current bar pairs connected to them. This arrangement contains a symmetry. In an operating state with connected current bars and intermediate circuit capacitor module, the symmetrical arrangement means that the current-carrying conductors of one potential and the current-carrying conductors of the other potential are spatially close to one another, minimizing the size of the conductor loops formed in this way and thus minimizing the inductance.

The system can have a high impedance symmetry, allowing a symmetrical current flow in and out of the intermediate circuit capacitor module. Following symmetries are advantageous and possible independently of one another.

According to one embodiment, the impedances of the terminals of the first DC terminal pair are essentially identical.

According to one embodiment, the impedances of the terminals of the first DC capacitor terminal pair are essentially identical.

According to one embodiment, the impedances of the terminals of the second DC capacitor terminal pair are essentially identical.

According to one embodiment, the impedances of the terminals of the second DC terminal pair are essentially identical.

According to one embodiment, the impedances of the terminals of the first DC capacitor terminal pair and of the second DC capacitor terminal pair are essentially identical.

According to one embodiment, the impedances of the terminals of the first DC terminal pair and of the second DC terminal pair are essentially identical.

According to one embodiment, the first DC terminal pair, the first DC capacitor terminal pair, and the switching device each have a first terminal and furthermore the power phase module has a first cross bridge that electrically connects the first terminals of the first DC terminal pair, of the first DC capacitor terminal pair, and of the switching device.

According to one embodiment, the first DC terminal pair, the first DC capacitor terminal pair, and the switching device each have a second terminal and furthermore the power phase module has a second cross bridge that electrically connects the second terminals of the first DC terminal pair, of the first DC capacitor terminal pair, and of the switching device.

According to a further development of the embodiment, the first cross bridge additionally connects the first terminals of other DC terminal pairs and/or other DC capacitor terminal pairs and/or further switching devices. Likewise, the second cross bridge can additionally connect the second terminals of other DC terminal pairs and/or of other DC capacitor terminal pairs and/or of other switching devices.

Multiple switching devices that are connected in parallel can be connected through, in each case, a first terminal with the first cross bridge and possibly through, in each case, a second terminal with the second cross bridge.

According to this embodiment, in an operating state of the power phase module the two cross bridges carry a direct current from the terminals of the DC terminal pair(s) to the switching device(s) and through the DC capacitor terminal pair(s) to the intermediate circuit capacitor module.

The first cross bridge and the second cross bridge can run directly next to one another and sections of them can run parallel to one another, without being in direct electrical contact. This produces an essentially symmetric impedance for multiple switching devices that are connected in parallel. This allows a symmetrical current flow through the cross bridges and the switching devices.

The cross bridges are designed for a high current load. Their ohmic resistance is as low as possible. The cross bridges can have metals with high conductivity, in particular copper or aluminum. Furthermore, the cross bridges can have a coating that serves as corrosion protection and/or as protection from electrical flashovers, for example.

According to one embodiment, the cross bridges are formed in a single piece, for example from a piece of sheet metal. The cross bridges can have a coating. The pieces of sheet metal can have bent areas on the face of the power phase module and be shaped into DC terminals.

According to one embodiment, the first DC terminal pair and the first DC capacitor terminal pair are formed from sheet metal areas bent away from cross bridges and these sheet metal areas are arranged essentially in a plane, the respective connection elements of the first DC terminal pair and of the first DC capacitor terminal pair being formed on or in the bent sheet metal areas.

According to one embodiment, the DC capacitor terminal pair is formed on the face in such a way that moving the power phase module with the face first produces a contact between the DC capacitor terminal pair and an intermediate circuit capacitor module placed on the face. The power phase module can be pushed face first onto terminals of the intermediate circuit capacitor module. To accomplish this, the power phase module can be movably mounted so that the face is oriented essentially vertically. To accomplish this, the power phase module can have supports, for example guide rails. This moving can also connect the cooling device with a terminal of a coolant system provided for this purpose.

According to one embodiment, multiple power phase modules can be arranged next to one another in such a way that each of their faces is oriented essentially vertically. In particular, the faces of the multiple power phase modules can be arranged parallel to one another and/or in a plane and/or the power phase modules can be arranged pointing in the same direction.

According to one embodiment, the power phase module is in the form of a component of a modular converter. In particular, it can be installed in the converter in a replaceable and detachably fastenable manner. The total mass of the power phase module is less than 50 kg, in particular less than 30 kg. This allows the power phase module to be installed and removed without mechanical lifting devices. The capacitors of the intermediate circuit capacitor module that are in an operating state in the commutation circuit can make a low-inductance connection to the switching devices.

Furthermore, a converter is proposed with at least two, in particular at least three, power phase modules. The converter has at least two, in particular at least three, intermediate circuit capacitor modules, the face of each power phase module being arranged on an intermediate circuit capacitor module that is associated with it, and the first DC capacitor terminal pair of each power phase module being detachably connected with corresponding contact elements of the associated intermediate circuit capacitor module.

The use of multiple intermediate circuit capacitor modules in a converter and their placement close to the power phase modules or the switching devices reduces the inductance of the connections. The capacitors in the intermediate circuit capacitor modules have a lower load, and their life is extended.

Each intermediate circuit capacitor module is associated with a power phase module and connected to it by connection elements. The intermediate circuit capacitor module has contact elements corresponding to it.

According to one embodiment, the converter also has a current bar pair with a first current bar and a second current bar running parallel to the first current bar to conduct a direct current. The first current bar and the second current bar lie essentially in a plane and the faces of the power phase modules are arranged next to one another and parallel to this plane, the first DC terminal pair of each power phase module being connected to the first current bar and to the second current bar through its connection elements. The current bar also connects the power phase modules with other intermediate circuit capacitor modules, however these connections have a greater ohmic resistance and a greater inductance than the direct connection to the intermediate circuit capacitor module associated with the power phase module.

According to one embodiment, the converter further has a connector pair with a first connector and a second connector, the first connector and the second connector lying essentially in a plane and the faces of the power phase modules being arranged next to one another and parallel to this plane, and the first DC capacitor terminal pair of each power phase module being connected to a first connector and a second connector through its connection elements. To accomplish this, the connection elements of the first DC capacitor terminal pair can be connected with corresponding contact elements of the intermediate circuit capacitor modules and with the first and second connectors.

According to a further development of the embodiment, the converter further has a second current bar pair with a third current bar and a fourth current bar to conduct a direct current. Sections of the first current bar, the second current bar, the third current bar, and the fourth current bar can run in parallel and lie essentially in a plane, and the terminals of the second DC terminal pair are connectable to the third current bar and to the fourth current bar.

According to a further development of the embodiment, the converter further has a second connector pair with a third connector and a fourth connector, the third connector and the fourth connector lying essentially in a plane and the faces of the power phase modules being arranged next to one another and parallel to this plane, and the second DC capacitor terminal pair of each power phase module being connected to the third connector and the fourth connector through its connection elements. To accomplish this, the connection elements of the second DC capacitor terminal pair can be connected with corresponding contact elements of the intermediate circuit capacitor modules and with the third and fourth connectors.

According to one embodiment, the first, second, third, and fourth current bar and the first, second, third, and fourth connector lie in a plane.

According to one embodiment, current bars are designed as pairs and parallel in sections. They can be mechanically connected with one another but electrically insulated from one another, for example by a solid insulating material. The insulation can be formed of a synthetic material, for example. The electrical conductivity and the thickness of the insulation are designed so that a voltage of more than 500V, in particular 600V to approximately 4500V can be applied across the current bars.

According to one embodiment, the first DC terminal pairs of adjacent power phase modules together with the first current bar pair form a high-inductance, low-resistance parallel connection between adjacent power phase modules, and the connector pair together forms a low-inductance, high-resistance connection between adjacent intermediate circuit capacitor modules. Therefore, the intermediate circuit capacitor modules are electrically connected in parallel on two paths.

The low-inductance, high-resistance connections are between the intermediate circuit capacitor modules. These connections are spatially short and direct in comparison with the high-inductance, low-resistance connections that run through the power phase modules.

According to one embodiment, the first and second cross bridges are part of the high-inductance, low-resistance connections. In this case, a high-inductance, low-resistance connection extends from an intermediate circuit capacitor module through a terminal of the DC capacitor terminal pair, on through one of the cross bridges, through a terminal of the DC terminal pair, out of the power phase module associated with the intermediate circuit capacitor module through one of the current bars into an adjacent power phase module, through a terminal of the DC terminal pair, on through one of the cross bridges, through a terminal of the DC capacitor terminal pair into the adjacent intermediate circuit capacitor module.

A high-inductance, low-resistance parallel connection between adjacent intermediate circuit capacitor modules consists of two high-inductance, low-resistance connections.

The low-inductance, high-resistance connections between the intermediate circuit capacitor modules are formed by the connectors. The connectors can consist of pieces of sheet metal, for example a piece of sheet steel. They can run in a single piece through multiple intermediate circuit capacitor modules, or be composed of individual sections.

A low-inductance, high-resistance parallel connection between adjacent intermediate circuit capacitor modules consists of two low-inductance, high-resistance connections.

According to one embodiment, the connectors have a higher ohmic resistance value in an area between two intermediate circuit capacitor modules than they do directly on the intermediate circuit capacitor modules. For example this can involve the conducting material, for example a piece of sheet metal, having a smaller cross section. A smaller cross section can be produced by recesses in the conducting material. An increased ohmic resistance at this place has the result that electrical energy is deliberately converted into heat there. In regular operation, this deliberately converts parasitic oscillating currents in the low-inductance, high-resistance connections into heat, and advantageously damps them. In the case of a short circuit, heat is produced deliberately in the connectors between the intermediate circuit capacitor modules, making the electrical energy harmless. Nearby electronic components, such as the intermediate circuit capacitor modules, are spared from high currents and heat generation.

According to one embodiment, the inductance of the connectors is higher by at least a factor of 2, in particular by at least a factor of 5, than that of the parallel high-resistance, low-inductance connections through the current bars and the cross bridges. For example, the inductance of the low-resistance, high-inductance connections between two intermediate circuit capacitor modules lies in the range from 100 nH to 300 nH, and the inductance of the high-resistance, low-inductance connections lies in the range from 10 nH to 30 nH. These values refer to an operating state with the associated current flow of a few hundred amps.

Since the converter, in particular the power phase module, is designed for very high currents, the arrangement represents a very weakly damped C-L-C-L chain conductor. The impressed currents of the switching devices excite oscillating currents. These oscillating currents increase the effective value of the current in the intermediate circuit capacitor modules.

According to one embodiment, the modular intermediate circuit forms a C-L-C-L chain conductor with the L component having inductance L of the first low-resistance, high-inductance connections or the second low-resistance, high-inductance connections and the C component having capacitance C of the intermediate circuit capacitor module, the L component and the C component forming an LC oscillating circuit and the first high-resistance, low-inductance connection or the second high-resistance, low-inductance connection additionally being connected in parallel with the L component of the LC oscillating circuit.

While direct current and the low-frequency AC component flow through the low-resistance, high-inductance connections, higher frequency AC components are conducted through the low-inductance, high-resistance connections between the intermediate circuit capacitor modules, which have lower inductance but higher ohmic resistance, and in the process these higher frequency AC components are damped. This reduces the effective currents in the low-resistance, high-inductance connections and in the intermediate circuit capacitors.

In the case of a short circuit in a power phase module, the capacitor(s) of the associated intermediate circuit capacitor module is/are very quickly discharged. The other capacitors of surrounding intermediate circuit capacitor modules feed in to the short circuit through the current bars and the connectors. The connectors between the intermediate circuit capacitor modules cause, due to their ohmic resistance, a rapid decay in the oscillations caused by the short circuit. A large part of the short circuit energy is converted into heat in the connectors, making it harmless. This can protect the other power phase modules and intermediate circuit capacitor modules from destruction.

According to one embodiment, the power phase module has both a first and a second DC terminal pair and both a first and a second DC capacitor terminal pair. Furthermore, the converter has both a first and a second current bar pair and both a first and a second connector pair. The first DC terminal pair of adjacent power phase modules together with the first current bar pair forms a high-inductance, low-resistance parallel connection between adjacent intermediate circuit capacitor modules, and the first connector pair forms a low-inductance, high-resistance connection between adjacent power phase modules. There, in an analogous manner, the second DC terminal pair of adjacent power phase modules together with the second current bar pair forms a second high-inductance, low-resistance connection between adjacent intermediate circuit capacitor modules, and the second connector pair forms a second low-inductance, high-resistance parallel connection between adjacent power phase modules.

This results in a symmetry, which allows current-carrying conductors, that is current bars and connectors, to be routed closely together with, in each case, one associated second conductor of opposite current direction. This construction optimizes the inductance by minimizing conductor loop sizes.

According to one embodiment, a vehicle is proposed, in particular a rail vehicle, with an energy converter for converting electrical energy into kinetic energy, or vice versa, and a converter, wherein at least one AC terminal of a power phase module is connected with the energy converter.

The alternating current produced by the converter can be used, for example, to drive an electric motor to power the vehicle. In the same way, current can be supplied to the on-board electronic system. The frequency and voltage at the AC output(s) can be adapted to the use in the vehicle.

In the same way, an energy converter can act as a dynamo/generator, for example during braking. Then, the dynamo produces electrical energy from mechanical energy, and this electrical energy is carried to the converter. The converter converts the alternating current into direct current.

Vehicles that are considered rail vehicles are, in particular trains, subways, metros, streetcars, high-speed trains, or similar vehicles.

BRIEF DESCRIPTION OF THE FIGURES

The attached drawings illustrate embodiments and serve, together with the description, to explain the principles of the invention. The elements of the drawings are scaled relative to one another and are not necessarily true to scale. The same reference signs are used to designate similar parts.

DETAILED DESCRIPTION

Figure 1:
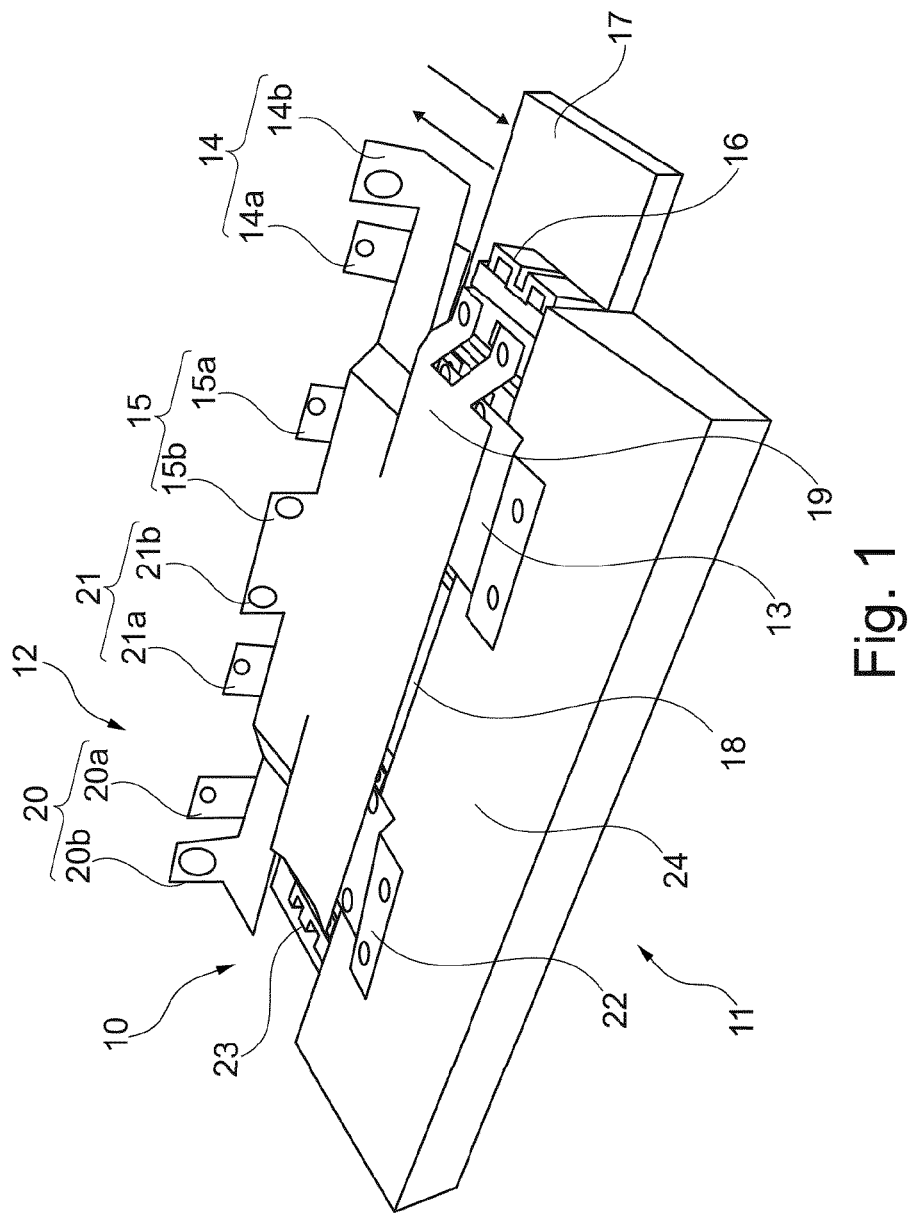
FIG. 1 shows a power phase module according to one embodiment.

FIG. 1 shows an embodiment of a power phase module 10. The power phase module 10 has approximately the shape of a flattened cuboid with two large-area sides and four small-area sides. The small-area sides can be faces of the power phase module 10. One face 12 of the power phase module 10 has a first DC terminal pair 14 and a second DC terminal pair 20 arranged on it. The face 12 also has a first DC capacitor terminal pair 15 and a second DC capacitor terminal pair 21 arranged on it.

Another side, in this case the opposite face 11 of the power phase module 10, has a first AC terminal 13 arranged on it. The opposite face 11 also has a second AC terminal 22 arranged on it.

The first switching device 16 is connected with the first DC terminal pair 14 and the first AC terminal 13. The switching device 16 is arranged on a cooling device 17, so that the cooling device 17 can carry heat that arises from the switching device 16 away and out of the power phase module 10.

The power phase module 10 further has a second switching device 23 that is connected with the first DC terminal pair 14 and with a second AC terminal 22. It is arranged on the cooling device 17 next to the first switching device 16. The two switching devices 16, 23 are arranged in a plane perpendicular to the face.

The DC capacitor terminal pairs 15, 21 are arranged next to one another and between the two DC terminal pairs 14, 20. The DC capacitor terminal pairs 15, 21 and the DC terminal pairs 14, 20 are arranged in a plane and in a row.

Figure 2:
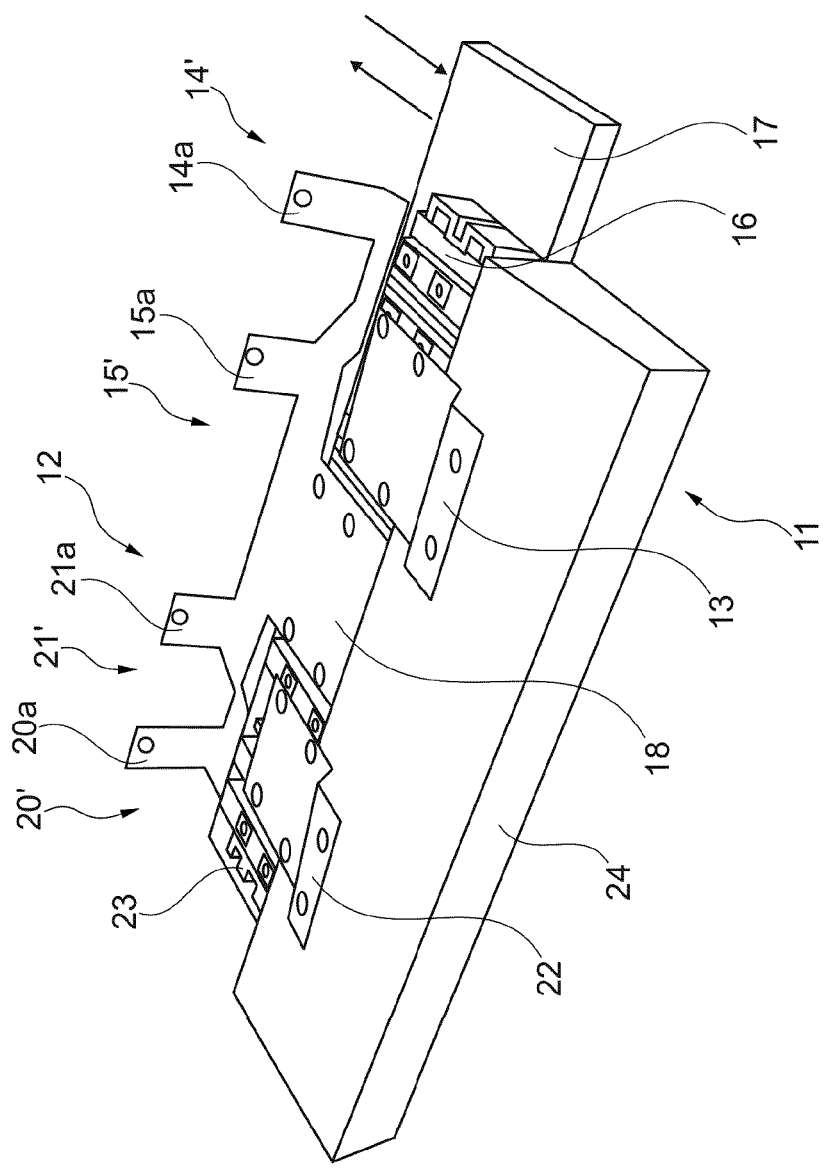
FIG. 2 shows the power phase module according to the embodiment of FIG. 1, wherein a cross bridge has been removed.

The DC capacitor terminal pairs 15, 21 and the DC terminal pairs 14, 20 each have a first terminal 14a, 15a, 20a, 21a and a second terminal 14b, 15b, 20b, 21b. Connection elements are arranged in or on the terminals. The first terminals 14a, 15a, 20a, 21a are connected together through a first cross bridge 18. The second terminals 14b, 15b, 20b, 21b are connected together through a second cross bridge 19. Details of the second cross bridge 19 are hidden in FIG. 1. These details are illustrated in FIG. 2, which shows an embodiment of the power phase module 10 in which no second cross bridge 19 is shown.

The first terminals 14a, 15a, 20a, 21a are formed in a single piece with the first cross bridge 18. The first cross bridge 18 has a piece of sheet metal. Bent areas of the pieces of sheet metal form the first terminals 14a, 15a, 20a, 21a for connecting to current bars. The connection elements are in the form of drill holes for a screw connection, for example. The first terminals 14a, 15a, 20a, 21a can also be put together from multiple pieces, i.e., from multiple parts. In one embodiment, this applies in an analogous, but not necessarily identical manner for the second cross bridge 19 and the second terminals 14b, 15b, 20b, 21b. The first cross bridge 18 and the second cross bridge 19 can be designed differently, and can differ, for example, by being in a single piece or by having different materials or coatings.

The first cross bridge 18 connects the first terminal 14a of the first DC terminal pair 14 with the first switching device 16. The second cross bridge 19 connects the second terminal 14b of the first DC terminal pair 14 with the first switching device 16. This causes the direct current to flow from the first DC terminal pair 14 through the cross bridges 18, 19 into the switching device 16, where it is converted. The alternating current that is produced can be tapped at the first AC terminal 13. Conversely, it is also possible to convert an alternating current into a direct current.

The first and second cross bridges 18, 19 run directly next to one another, and sections of them are parallel. They are spatially close to one another and are electrically insulated from one another, and are designed for high voltages of over 500V, in particular voltages between approximately 600V and 4,500V, and for high currents of more than 100 A, in particular for currents from 100 A to 1,000 A. For example, the current in a dual switching module can be 500 A and in a single switching module it can be 800 A. The applied voltage can limit the current flow by means of a maximum power in an operating state.

In this embodiment, a cross bridge 18, 19 has a large-area sheet metal area and at least two areas bent away from it. In an operating state, the cross bridges 18, 19 have a high current of multiple hundred amps flowing through them. Therefore, the material and thickness of the cross bridges 18, 19 must be correspondingly adapted to this current load.

The large-area sheet metal area of the cross bridges 18, 19 can be essentially parallel to the large-area sides of the power phase module. Therefore, the cross bridges 18, 19 can be arranged transverse, that is essentially perpendicular, to the course of connected current bars.

For example, the cooling device 17 can be arranged on or along one of the large-area sides of the power phase module, or it can form one of these sides. The switching device 16 can be arranged on the cooling device 17. The cooling device 17 can be arranged on one side of the switching device 16, and the cross bridges 18, 19 can be arranged on an opposite side of the switching device 16.

In this embodiment, the switching devices 16, 23 have a dual switching module and therefore are connected with both the first cross bridge 18 and the second cross bridge 19. Dual switching modules are electrically built as full-wave rectifiers and can convert both potentials of the two cross bridges 18, 19 for the alternating current phase.

In an operating state, each switching device 16, 23 can be operated independently from one another by a controller 24, in particular a gate controller, as a full-wave rectifier, and produce an alternating current at the respective AC terminal 13, 22. In particular, the switching devices have controllable semiconductor elements. These semiconductor elements can be semiconductor elements with controllable gate electrodes. Then, the controller 24 controls the gate voltages at the gate electrodes and thereby the current flow through the semiconductor elements or the switching device 16, 23. In particular, the semiconductor elements can be IGBTs, and the controller comprises the gate controller 24 of the gates of the IGBTs.

According to one embodiment, the controller 24 can be arranged on a face opposite the terminal pairs of the power phase module; this face can also be referred to as second or rear face.

According to one embodiment, the controller 24 can be mechanically supported by the cooling device 17 or the switching devices 16, 23, or by both.

The power phase module 10 in FIG. 1 has two DC capacitor terminal pairs 15, 21. There, the terminals 15a, 15b, 21a, 21b are arranged in a row so that in an operating state the two second terminals 15b, 21b lie at one potential and are surrounded from outside by the first terminals 15a, 21a, which are at another potential. This produces a mirror symmetry of the terminals and thus of the potentials. In this embodiment, the terminals of the two DC terminal pairs 14, 20 have mirror symmetry in the same way. Each of the first terminals 14a, 15a, 20a, 21a, and second terminals 14b, 15b, 20b, 21b can also be interchanged with the associated terminal of the respective pair. The mirror symmetry is maintained. The symmetry has the advantage that the impedance is identical, or almost identical, at the terminals for both current directions in each case. This allows a uniform current flow.

To connect the DC terminals 14a, 15a, 20a, 21a, 14b, 15b, 20b, 21b to current bars or to an intermediate circuit capacitor module, these DC terminals can have connection elements for electrical connection and/or a fastener for mechanical fastening. In this sample embodiment, holes are provided for inserting a corresponding contact element and/or fastener.

The connection elements of the DC capacitor terminals 21, 15 can be differently designed than the connection elements of the DC terminal pairs 14, 20. For example, drill hole sizes can vary or completely different connection elements can be used. The distance of the first terminal 14a, 15a, 20a, 21a to the second terminal 14b, 15b, 20b, 21b in the case of the DC capacitor terminal pair(s) 15, 21 can be as well different as in the case of the DC terminal pair(s) 14, 20. The DC capacitor terminal pairs 15, 21 are connected to connectors and intermediate circuit capacitor modules, and the DC terminal pairs 14, 20 are connected to current bars.

The power phase module 10 in FIG. 1 has a gate controller 24. The gate controller 24 is connected with the switching devices 16, 23. It controls the switching devices 16, 23 in such a way that an applied direct voltage is converted into an alternating voltage at the switching device 16, 23 or vice versa. In particular, the switching device can have IGBTs with a controllable gate.

The gate controller 24 specifies a frequency at which the switching devices 16, 23 are controlled so that an alternating voltage with the corresponding frequency is produced at the respective AC outputs 13, 22. The frequencies and/or voltage curve of the AC outputs can be different. In particular, the alternating voltages can be matched to one another so that different phase inputs of an electric motor can be fed with different AC outputs 13, 22.

The cooling device 17 can have hydraulic connections to carry coolant into and out of the cooling device 17. The hydraulic connections are advantageously arranged on the face 12, so that a connection by pushing the power phase module 10 onto the current bar pair and the intermediate circuit capacitor module also connects the cooling device with its hydraulic connections to a coolant guiding system.

FIG. 2 shows the embodiment of the power phase module 10 of FIG. 1 without the second cross bridge 19 and the first terminals 14b, 15b, 20b, 21b, of the DC capacitor terminal pairs 15', 21' and the DC terminal pairs 14', 20'.

In FIG. 1 the second cross bridge 19 concealed the fact that the switching device 16 is connected with the first cross bridge 18. Likewise, the switching device 16 is connected with its associated AC terminal 13.

Figure 3:
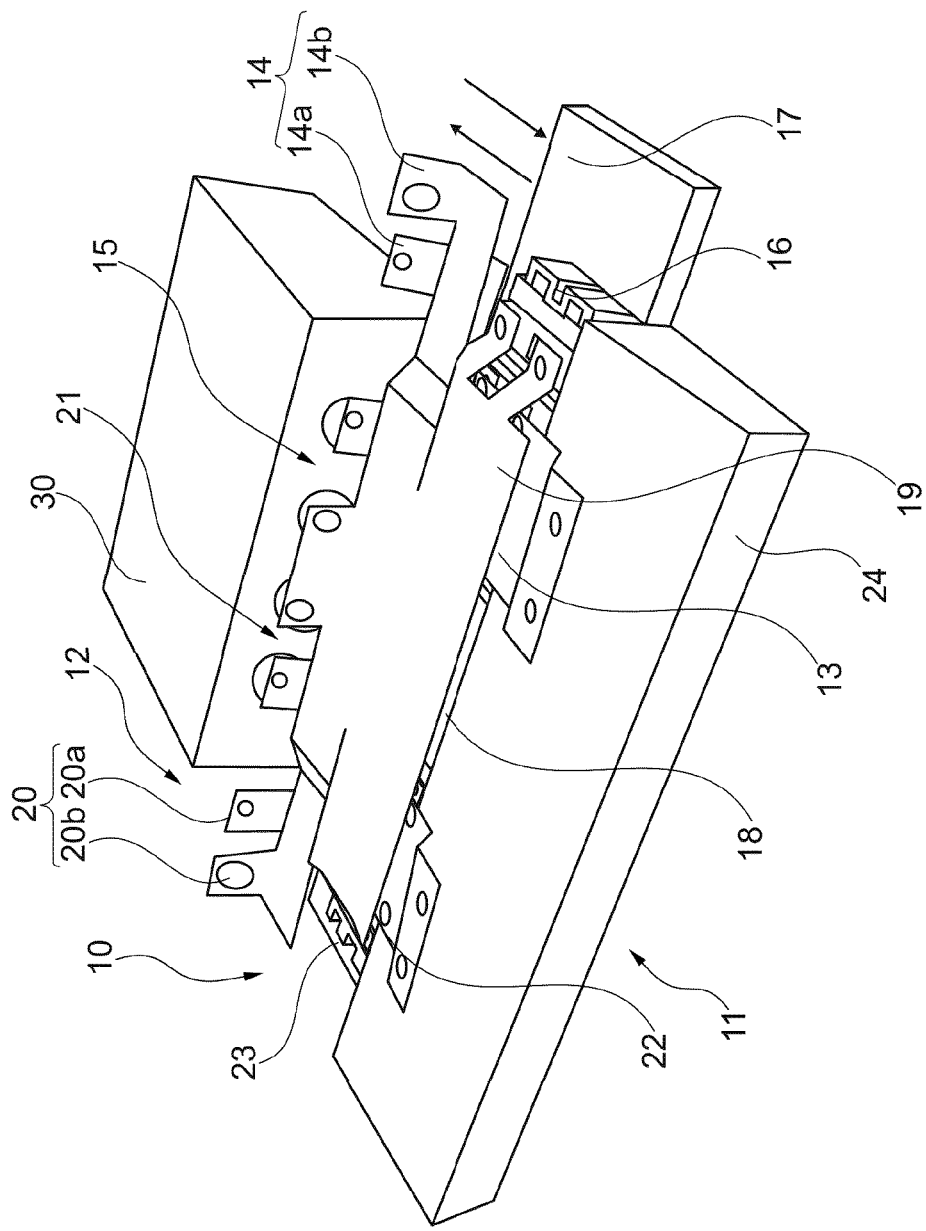
FIG. 3 shows the power phase module according to the embodiment of FIG. 1 with an intermediate circuit capacitor module connected to it.

FIG. 3 shows the power phase module 10 with an intermediate circuit capacitor module 30 connected to it. The intermediate circuit capacitor module 30 has four terminals and therefore is connected to both the first DC capacitor terminal pair 15 and also to the second DC capacitor terminal pair 21.

In this embodiment, the switching devices 16, 23 make contact with the cross bridges 18, 19 via, in each case, two contact points. Each switching device is in the form of a dual switching module and has two half bridges, each half bridge making contact with the cross bridges via one contact point.

The intermediate circuit capacitor module 30 has at least one capacitor, which is capable of serving as an intermediate circuit capacitor. The cross bridges 18, 19 together with the capacitor of the intermediate circuit capacitor module 30 are part of the intermediate circuit in an operating state of the power phase module 10 or of the converter. The intermediate circuit capacitor is part of the commutation circuit, that is also the electric circuit in which the current changes during a switching operation of the switching device 16, 23. Therefore, the intermediate circuit capacitor of the intermediate circuit capacitor module 30 is also referred to as a commutation capacitor.

The electrical connection between switching devices 16, 23 and intermediate circuit capacitor module 30 is low-inductance. This is achieved by the compact structure of the power phase module 10. The intermediate circuit capacitor module 30 is spatially closely connected to the switching devices 16, 23, and thus its connection is low-inductance. In addition, the cross bridges 18, 19 are arranged close to one another or on top of one another. This causes optimal overlap among the current paths in the cross bridges 18, 19 between switching device 16, 23, intermediate circuit capacitor module 30, and DC terminal pairs 14, 20, and the inductance of the power phase module 10 is reduced.

Figure 4:
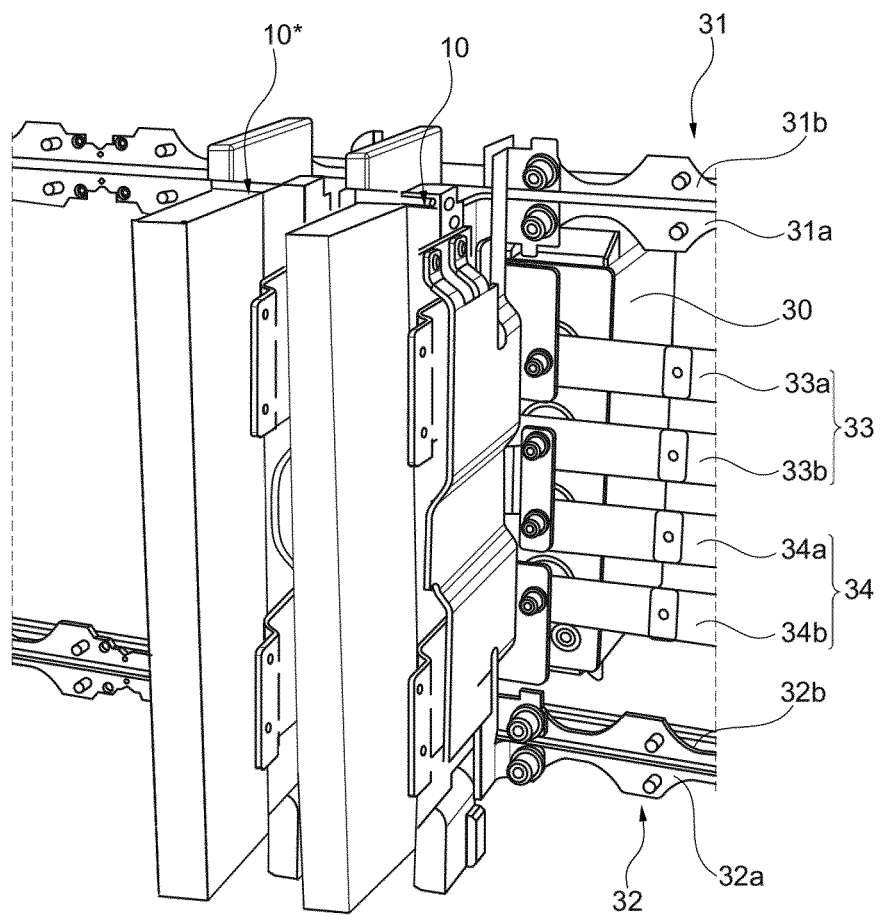
FIG. 4 shows a converter according to one embodiment.

FIG. 4 shows a converter according to an embodiment with two power phase modules 10, 10*. For clarity, only two power phase modules 10, 10* are shown. More power phase modules can be arranged next to the others, according to the orientation of the two that are shown. The power phase modules 10, 10* are arranged next to one another so that their faces point in the same direction.

Figure 5:
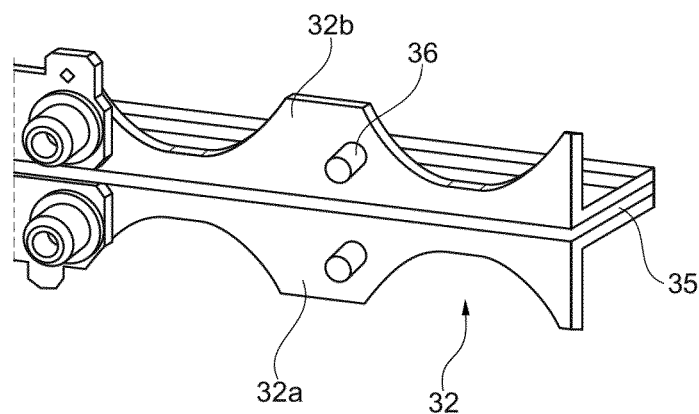
FIG. 5 shows a detail view of current bars according to one embodiment.

The DC terminal pairs are each connected to current bar pairs 31, 32 that run behind the faces of the power phase modules 10, 10*. The current bar pairs 31, 32 have a first current bar 31a, a second current bar 31b, a third current bar 32a, and a fourth current bar 32a. A detail view of a current bar pair 32 is shown in FIG. 5.

Each power phase module 10, 10* is associated with an intermediate circuit capacitor module 30, 30* and each power phase module 10, 10* is connected to its DC capacitor terminal pairs with the associated intermediate circuit capacitor module 30, 30*. In the representation shown in FIG. 4, the second intermediate circuit capacitor module 30* is not visible, since it is arranged behind the power phase module 10*, on its face. The connection is made electrically and mechanically through connection elements. The connection elements with the corresponding contact elements are holes or nuts and bolts.

The current bar pairs 31, 32 run essentially parallel to one another and are spaced apart from one another so that the intermediate circuit capacitor module 30 can be placed between the current bar pairs 31, 32. Then, the terminals of the current bar pairs 31, 32 and the terminals of the intermediate circuit capacitor module 30 are arranged in a plane and in a row, so that the power phase module can be pushed onto this plane with its face first, and connected.

The converter has connector pairs 33, 34. The first connector 33a, the second connector 33b, the third connector 34a, and the fourth connector 34b electrically connect the intermediate circuit capacitor modules 30 with one another. The number of connectors 33a, 33b, 34a, 34b can vary, depending on the number of terminals of the intermediate circuit capacitor modules 30 or the number of DC capacitor terminal pairs of the power phase modules 10, 10*. The number of connectors 33a, 33b, 34a, 34b, is advantageously identical with the number of terminals of the DC capacitor terminal pairs, so that all terminals can be connected. The connectors 33a, 33b, 34a, 34b connect the intermediate circuit capacitor modules 30, so that they are connected in parallel.

According to one embodiment, in case of a converter with connectors 33a, 33b, 34a, 34b, both the intermediate circuit capacitor modules 30, 30* and the switching devices 16, 16* are connected in parallel in the power phase modules 10, 10*. In addition to the parallel connection through the connectors 33a, 33b, 34a, 34b, the switching devices 16, 16* and the intermediate circuit capacitor modules 30, 30* are connected in parallel through the current bars 31a, 31b, 32a, 32b and the cross bridges 18, 19, 18*, 19*. This second parallel connection has a higher inductance and a lower ohmic resistance than that of the connectors 33a, 33b, 34a, 34b. Therefore, the intermediate circuit capacitor modules 30, 30* are electrically connected in parallel through two low-inductance, high-resistance connections, on the one hand, and, on the other hand, through two high-inductance, low-resistance connections.

According to one embodiment, the material of the connectors 33a, 33b, 34a, 34b has a greater specific resistance than the material of the current bars 31a, 31b, 32a, 32b does. For example, the connectors 33a, 33b, 34a, 34b are made essentially from a steel, and the current bars 31a, 31b, 32a, 32b are made essentially of copper or aluminum.

The connectors 33a, 33b, 34a, 34b are made, for example, from a piece of sheet metal. This piece of sheet metal can be put together in sections, so that removal of an intermediate circuit capacitor module 30, 30* only requires removing the connectors 33a, 33b, 34a, 34b at the connection points to the intermediate circuit capacitor module 30, 30*.

FIG. 5 shows a detail view of a current bar pair 32 with a first current bar 32a and a second current bar 32b. The current bars are mechanically connected with one another and are electrically insulated from one another by an insulation 35. This insulation can consist of a solid material, for example a synthetic material.

Current bars can have a corresponding contact element 36 for fastening to the connection element of a DC terminal pair. In this sample embodiment, the corresponding contact element is a pin with or without thread to fasten a nut or a clip, for example, to a DC terminal pair 14, 20.

Figure 6:
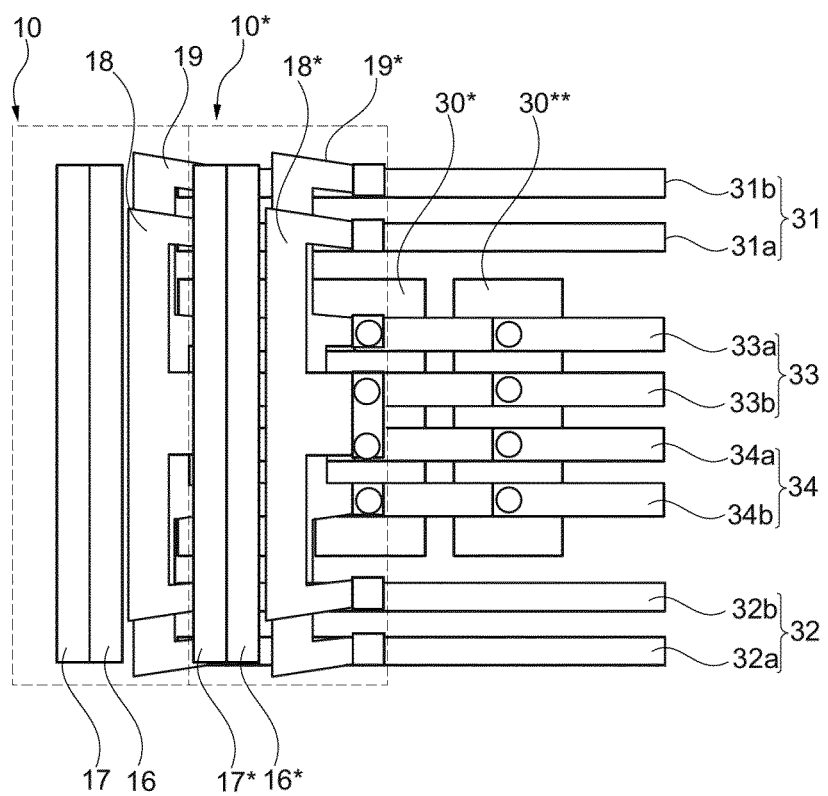
FIG. 6 is a schematic representation of the arrangement of the converter.

FIG. 6 shows a simplified schematic representation of the removal of a modular converter. For clarity, only two power phase modules 10, 10\* are drawn in. Every power phase module 10, 10\* has a switching device 16, 16\* and a cooling device 17, 17\*. This illustration does not show AC terminals or control devices.

According to one embodiment, the power phase module has at least one controller 24 to control the switching device 16, 23. The controller is advantageously arranged on the other face 11. In particular, the controller can be a gate controller 24 and control of the switching device 16, 23 can be performed through gates in the semiconductor components.

The power phase modules 10, 10\* are connected to current bar pairs 31, 32. Between the current bar pairs 31, 32, intermediate circuit capacitor modules (30), 30\* are arranged. Every power phase module 10, 10\* has an intermediate circuit capacitor module (30), 30\* associated with it, but in this illustration only of one of the two intermediate circuit capacitor modules (30), 30\* can be seen. Another intermediate circuit capacitor module **30\*\* is arranged so that another power phase module with the same orientation as of the two other power phase modules 10, 10\*** could be placed above it.

The intermediate circuit capacitor modules 30 are connected in parallel through connectors 33*a*, 33*b*, 34*a*, 34*b*. In addition, the intermediate circuit capacitor modules are connected in parallel through the cross bridges 18, 19, 18\*, 19\* and the current bar pairs 31, 32.

Figure 7:
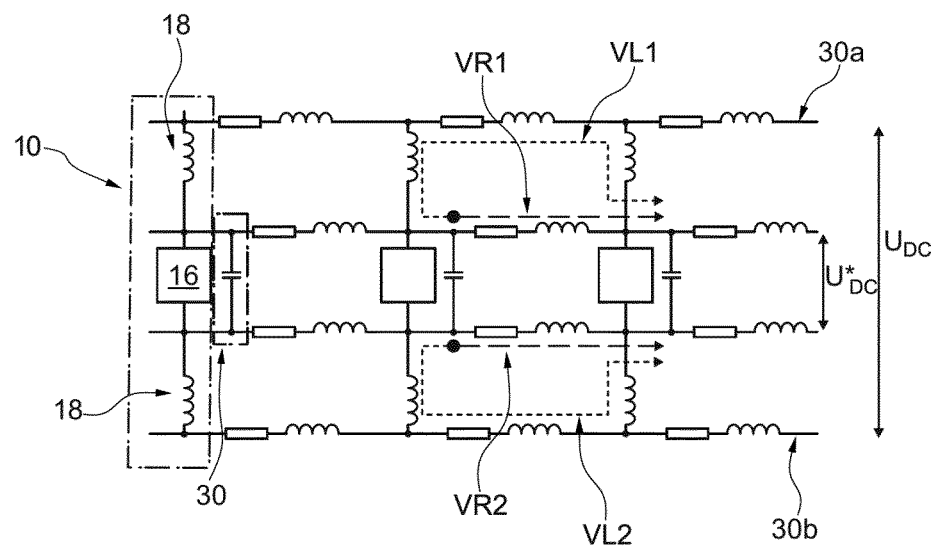
FIG. 7 shows a circuit diagram according to one embodiment.

FIG. 7 shows an embodiment of the modular intermediate circuit. Three intermediate circuit capacitor modules 30 are sketched. The switching devices 16 are connected in parallel with, in each case, an intermediate circuit capacitor module 30. For clarity, only one of the switching devices 16 and only one of the intermediate circuit capacitor modules 30 is labeled with a reference sign. In this embodiment, the three switching devices 16 shown and the three intermediate circuit capacitor modules 30 shown are identical. The intermediate circuit capacitor modules 30 have in each case a first terminal and a second terminal, the first terminals two intermediate circuit capacitor modules 30 following immediately one after another in each case in the chain being connected through a first low-resistance, high-inductance connection VL1 and a first high-resistance, low-inductance connection VR1, the second terminals two intermediate circuit capacitor modules 30 following immediately one after another in each case in the chain being connected through a second low-resistance, high-inductance connection VL2 and a second high-resistance, low-inductance connection VR2, the first high-resistance, low-inductance connection VR1 being connected in parallel with the second high-resistance, low-inductance connection VR2, and the first low-resistance, high-inductance connection VL1 being connected in parallel with the second low-resistance, high-inductance connection VL2.

The first low-resistance, high-inductance connection VL1 and the second low-resistance, high-inductance connection VL2 connect, in parallel and in a low-resistance high-inductance manner, the two intermediate circuit capacitor modules 30 following immediately one after another in each case in the chain. In addition, the first high-resistance, low-inductance connection VR1 and the second high-resistance, low-inductance connection VR2 connect, in parallel and in a high-resistance low-inductance manner, the two intermediate circuit capacitor modules 30 immediately following one after another in each case in the chain.

The impedances of the first low-resistance, high-inductance connection VL1 and of the second low-resistance, high-inductance connection VL2 are identical and the impedances of the first high-resistance, low-inductance connection VR1 and of the second high-resistance, low-inductance connection VR2 are identical. Therefore, the modular intermediate circuit has a symmetry that allows a symmetrical current flow in both current directions.

In the embodiment of FIG. 7, each of the intermediate circuit capacitor modules 30 has an intermediate circuit capacitor. Therefore, each of the capacitors shown forms an intermediate circuit capacitor module 30. Each intermediate circuit capacitor has a first terminal and a second terminal, and the first terminal and the second terminal of the intermediate circuit capacitor simultaneously form the first terminal and the second terminal of the intermediate circuit capacitor module. Alternatively, it is also possible for multiple intermediate circuit capacitors to form the intermediate circuit capacitor module 30.

The low-resistance, high-inductance connections VL1, VL2 can be realized, for example, by parallel current bars 30*a*, 30*b* and cross bridges 18. In an operating state there is a direct voltage $U_{DC}$ between the upper current bar 30*a* and the lower current bar 30*b*. This direct voltage $U_{DC}$ feeds the switching devices 16, which generate an alternating voltage through a control device. The associated intermediate circuit capacitors in the intermediate circuit capacitor modules 30 serve as temporary electrical storage and as buffers. Across the first terminal and the second terminal of the intermediate circuit capacitor modules 30 there is a voltage $U_p{}^*_c$. The circuit of the intermediate circuit capacitor modules 30 is parallel and in a chain relative to the direct voltage across the first terminal and the second terminal of the intermediate circuit capacitor module 30, this direct voltage being denoted as $U_{DC}^*$.

The low-resistance, high-inductance connections VL1, VL2 are shown by dotted lines, and each contains three inductors and one ohmic resistor. The high-resistance, low-inductance connections VR1, VR2 are shown by dashed lines, and each contains one inductor and one ohmic resistor. The ohmic resistance in each of the high-resistance, low-inductance connections VR1, VR2 is, in each case, greater than the ohmic resistance in the low-resistance, high-inductance connections VL1, VL2.

The inductances drawn and the ohmic resistances in FIG. 7 are essentially determined by the sizes of the conductor loops, the conductivity of the conductors, and the cross section of the conductor. Since the converter is designed as a power converter with high currents, the conductors must be correspondingly adapted. For example, the conductors that form the low-resistance, high-inductance connections VL1, VL2 have a material with high conductivity, in particular copper or aluminum, and the conductors that form the high-resistance, low-inductance connections VR1, VR2 have a material of lower conductivity, in particular steel.

Figure 8:
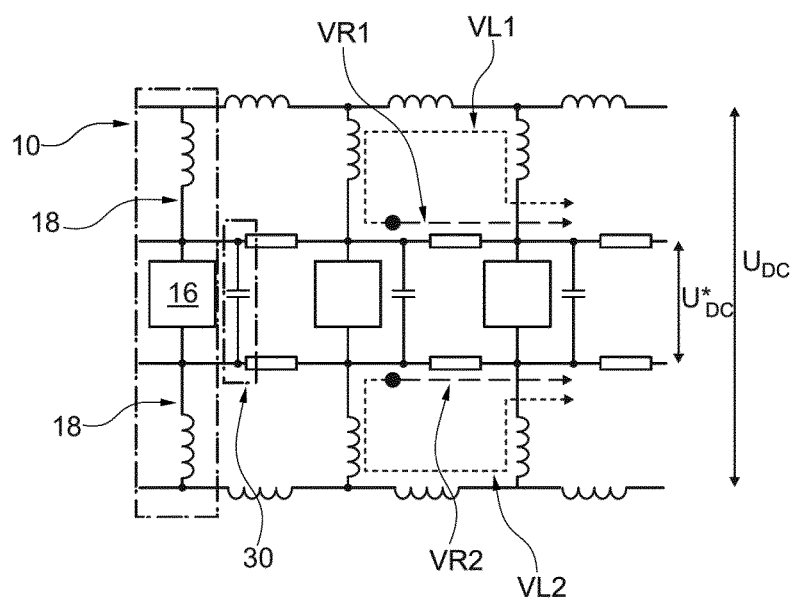
FIG. 8 shows a simplified circuit diagram according to one embodiment.

FIG. 8 shows a simplified representation of the circuit in FIG. 7. The ohmic resistances of the low-resistance, high-inductance connections VL1, VL2 and the inductances of the high-resistance, low-inductance connections VR1, VR2 are no longer drawn in. In practice, conductors without ohmic resistance or without inductance are not, per se, possible. Therefore, the circuit should be understood by the person skilled in the art so that the conductors are essentially characterized either by their inductive properties or by their ohmic properties.

Since the intermediate circuit is designed for very high currents, the arrangement without the high-resistance, low-inductance connections VR1, VR2 would represent a very weakly damped L-C chain conductor. In the representation shown in FIG. 8, the modular intermediate circuit forms an L-C chain conductor with an additional R component parallel to the L component. Here, the inductance of the high-resistance, low-inductance connections VR1, VR2 and the ohmic resistance of the low-resistance, high-inductance connections VL1, VL2 is neglected. The L component is formed by the inductance L of the first low-resistance, high-inductance connections VL1 and the second low-resistance, high-inductance connections VL2, and the C component is formed by the capacitance C of the intermediate circuit capacitor module 30, the L component and the C component forming an LC oscillating circuit and the R component additionally being connected in parallel with the L component. The R component is formed by the first high-resistance, low-inductance connection VR1 and the second high-resistance, low-inductance connection VR2. Therefore, the ohmic resistance of the high-resistance, low-inductance connections VR1, VR2 is connected in such a way that it damps the oscillation of the LC oscillating circuit.

In addition to the direct voltages $U_{DC}$ and the direct voltage $U_{DC}^*$, parasitic alternating voltage components are produced by the switching device and the LC oscillating circuit in the system. These alternating current components reduce the efficiency of the converter and should be damped. For optimal damping of the LC oscillating circuit, the ohmic resistance of the first high-resistance, low-inductance connections VR1 and the second high-resistance, low-inductance connections VR2 lies in the range from $0.1 \cdot R_{opt}$ to $10 \cdot R_{opt}$ and $R_{opt} = \sqrt{L/C}$ where L is the inductance of the low-resistance, high-inductance connections VL1, VL2 and C is the capacitance of the intermediate circuit capacitor module 30.

The modular intermediate circuit in FIGS. 7 and 8 can be expanded by other intermediate circuit capacitor modules with a corresponding circuit in parallel and in a chain with the other intermediate circuit capacitor modules 30. In particular, a modular intermediate circuit can have, for example, 1 to 6 or 1 to 8 intermediate circuit capacitor modules 30. All intermediate circuit capacitor modules 30 within the chain are identically connected among each other with their adjacent intermediate circuit capacitor modules 30. This is except for the two intermediate circuit capacitor modules 30 on the edges of the chain, since they have only one immediate neighbor.

In FIG. 8 the part of the circuit that corresponds to a power phase module 10 is drawn in. The switching device 16 and part of the low-resistance, high-inductance connections VL1, VL2, namely the cross bridges 18, are part of the power phase module 10. The high-resistance, low-inductance connections VR1, VR2 are not part of the power phase module. The power phase module 10 is also placed on the current bars 30a, 30b, forming the low-resistance, high-inductance connections VL1, VL2 with them and the cross bridges 18 arranged in the power phase module 10. This means that in this embodiment the modular intermediate circuit is produced only by means of the power phase module 10.

Figure 9:
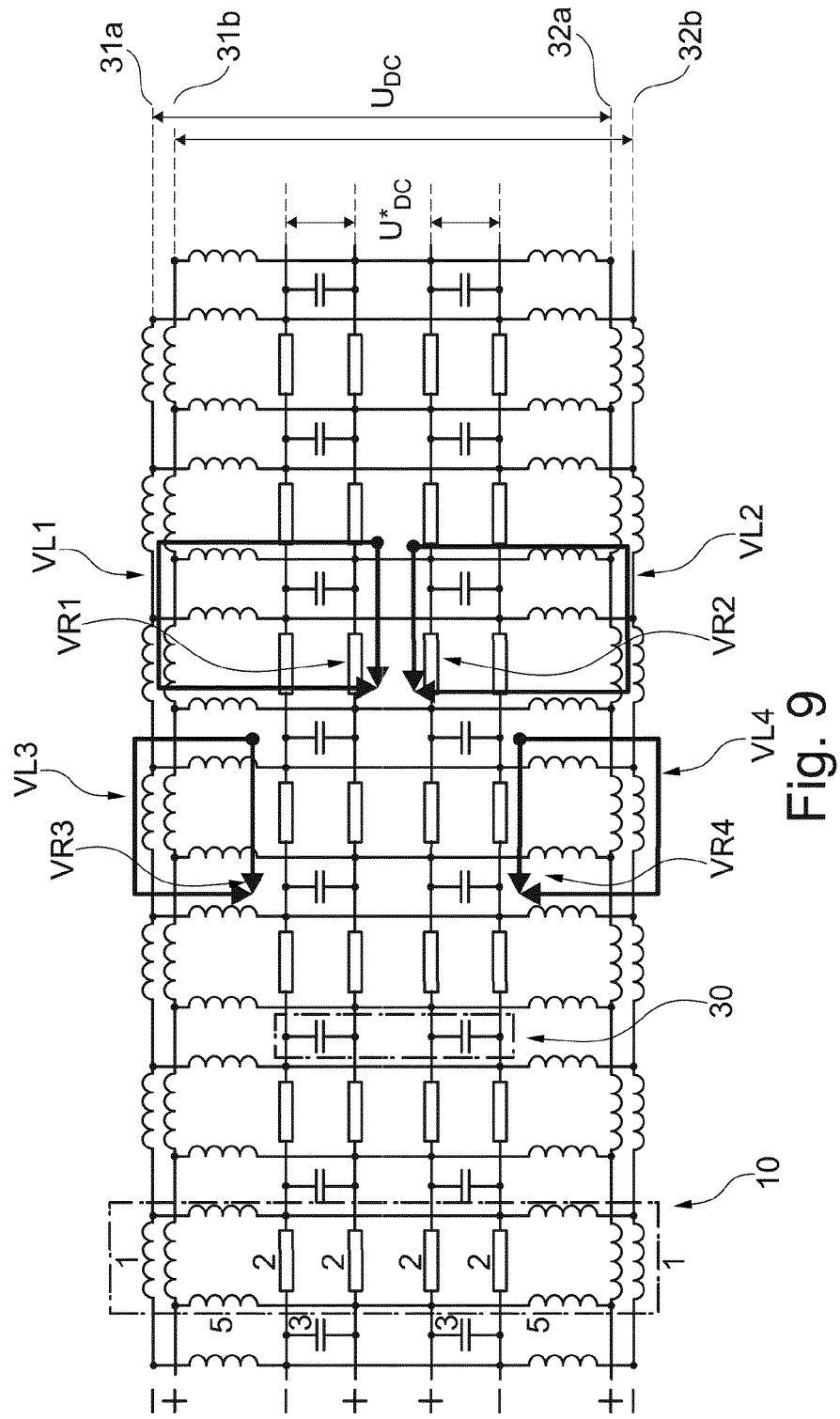
FIG. 9 shows a simplified equivalent circuit diagram of a converter with 8 power phase modules.

FIG. 9 shows an embodiment of the modular intermediate circuit. Eight modules are shown. For clarity, no switching devices are drawn in. They are in each case connectable parallel to the intermediate circuit capacitor modules 30. All intermediate circuit capacitor modules 30 are connected in parallel and in a chain. They have four terminals. To improve clarity, reference signs are also drawn in only once. Each module of the intermediate circuit has identical components.

In an analogous manner to FIG. 8, FIG. 9 does not show the ohmic resistances of the low-resistance, high-inductance connections VL1, VL2, VL3, VL4 or the inductances of the high-resistance, low-inductance connections VR1, VR2, VR3, VR4.

In the embodiment of FIG. 9, each of the intermediate circuit capacitor modules 30 has two intermediate circuit capacitors. The intermediate circuit capacitors are connected between a first terminal and a second terminal and between a third terminal and a fourth terminal of the intermediate circuit capacitor module 30. The second and the third terminal are at the same potential and the first and the fourth terminal are at the same potential. In an operating state, there is a direct voltage $U_{DC}^*$ across the first and the second terminals and across the third and the fourth terminal, respectively. With respect to this direct voltage, the two intermediate circuit capacitors are connected in parallel.

The four terminals of the intermediate circuit capacitor modules are in each case connected through one of the low-resistance, high-inductance connections VL1, VL2, VL3, VL4 and one of the high-resistance, low-inductance connections VR1, VR2, VR3, VR4. Here the first high-resistance, low-inductance connection VR1 is connected parallel to the second high-resistance, low-inductance connection VR2, the first low-resistance, high-inductance connection VL1 is connected parallel to the second low-resistance, high-inductance connection VL2, the third high-resistance, low-inductance connections VR3 are connected parallel to the fourth high-resistance, low-inductance connections VR4, and the third low-resistance, high-inductance connections VL3 are connected parallel to the fourth low-resistance, high-inductance connections VL4.

In particular, the four low-resistance, high-inductance connections VL1, VL2, VL3, VL4 are separate from one another and are essentially disjoint from one another, namely on the basis of the components that dominate their electrical properties. Likewise, however independently thereof, the high-resistance, low-inductance connections VR1, VR2, VR3, VR4 VL4 can, in the same way, be separate from one another and essentially disjoint from one another, namely on the basis of the components that dominate their electrical properties.

A direct voltage $U_{DC}$ is present across each one of the current bars 31a, 31b of the first current bar pair 31 and one of the current bars 32a, 32b of the second current bar pair 32. This direct voltage $U_{DC}$ feeds the switching devices, which are not drawn in, in an operating state in which the modular intermediate circuit in a converter circuit is used to produce an alternating voltage. At an AC output of the switching device, it is possible to tap an alternating voltage. In another operating state, the converter circuit can also conversely produce a direct voltage from an alternating voltage.

The modular intermediate circuit in FIG. 9 is set up so that every current-carrying conductor has another current-carrying conductor arranged spatially adjacent to it, whose current direction is opposite that of the first conductor. This minimizes the size of the conductor loops and reduces the inductance. Therefore, the converter circuit can also be geometrically implemented in a converter in the same way. The part of the circuit that would correspond to a power phase module 10 of a converter is sketched in the same way in FIG. 9, the switching device not being drawn in.

Figure 10:
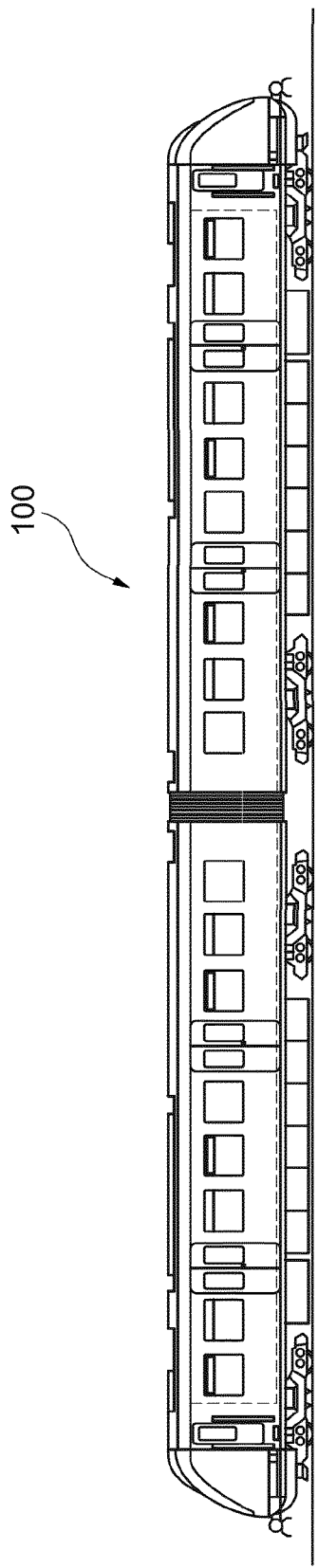
FIG. 10 shows a rail vehicle according to one embodiment.

FIG. 10 shows a rail vehicle 100 according to one embodiment, with an energy converter for converting electrical energy into kinetic energy, or vice versa, and a converter, wherein at least one AC terminal of a power phase module is connected with the energy converter. The alternating current produced by the converter can be used, for example, to drive an electric motor to power the vehicle. In the same way, it can supply current to the on-board electronic system. The frequency and voltage at the AC output(s) can be adapted to the use in the vehicle.

The above-described embodiments can be combined with one another in any way, for example the intermediate circuit capacitor modules 30 of FIGS. 7 and 8 can also have multiple intermediate circuit capacitors.

Even though specific embodiments have been presented and described here, it is within the scope of this invention to modify the embodiments shown in a suitable manner, without departing from the scope of protection of this invention. The following claims represent a first, non-binding attempt at defining the invention in general terms.

The invention claimed is:

1. A power phase module for a modular converter, the power phase module comprising:
   at least one first DC terminal pair with respective connection elements on a face of the power phase module for connection to a current bar pair,
   first DC capacitor terminal pair that is spaced apart from the first DC terminal pair and connected in parallel with the first DC terminal pair, the first DC capacitor terminal pair having respective connection elements on the face for connection to an intermediate circuit capacitor module associated with the power phase module, wherein the first DC terminal pair and the first DC capacitor terminal pair are formed from sheet metal areas bent away from cross bridges and the sheet metal areas are arranged in a plane, the respective connection elements of the first DC terminal pair and of the first DC capacitor terminal pair being formed on or in the bent sheet metal areas,
   a first AC terminal on another side of the power phase module,
   a switching device connected with the first AC terminal and the first DC terminal pair for converting a direct voltage, which is present across the first DC terminal pair in an operating state, into an alternating voltage produced at the first AC terminal, or vice versa,
   a cooling device to carry heat out of the power phase module.

2. The power phase module according to claim 1, further comprising:
   a second DC capacitor terminal pair that is arranged on the face of the power phase module, spaced apart from each the first DC terminal pair and the first DC capacitor terminal pair, and connected in parallel.

3. The power phase module according to claim 2, further comprising:
   a second DC terminal pair that is arranged on the face of the power phase module, spaced apart from each the first DC terminal pair and the first DC capacitor terminal pair, and connected in parallel.

4. The power phase module according to claim 3, wherein the first DC capacitor terminal pair or the first and the second DC capacitor terminal pair are arranged in a row between the first DC terminal pair and the second DC terminal pair.

5. The power phase module according to claim 2, wherein the first or the first and the second DC capacitor terminal pair are designed for detachable connection with corresponding contact elements of the intermediate circuit capacitor module that is mountable on the face.

6. The power phase module according to claim 5, wherein the contact elements of the intermediate circuit capacitor module are arranged exclusively on a surface of the intermediate circuit capacitor module, the surface being directly opposite the face of the power phase module.

7. The power phase module according to claim 3, wherein the connection elements of at least one of the first and the second DC capacitor terminal pair have a distance to one another that is different than a distance of the connection elements of at least one of the first and the second DC terminal pair.

8. The power phase module according to claim 1, wherein the first DC terminal pair, the first DC capacitor terminal pair, and the switching device each have a first and a second terminal, and wherein the power phase module further has:
   a first cross bridge that electrically connects the first terminals of the first DC terminal pair, of the first DC capacitor terminal pair, and of the switching device,
   a second cross bridge that electrically connects the second terminals of the first DC terminal pair, of the first DC capacitor terminal pair, and of the switching device.

9. The power phase module according to claim 8, wherein the first cross bridge and the second cross bridge run directly next to one another and sections of them run parallel to one another, without being in direct electrical contact.

10. The power phase module according to claim 1, wherein the power phase module has a total mass of less than 50 kg.

11. A converter with at least two power phase modules according to claim 1, and at least two intermediate circuit capacitor modules, wherein every power phase module is arranged with its face on an intermediate circuit capacitor module that is associated with the respective power phase module, and wherein at least one of the first and the second DC capacitor terminal pair of every power phase module is detachably connected with corresponding contact elements of the associated intermediate circuit capacitor module.

12. The converter according to claim 11, further having:
   a current bar pair with a first current bar and a second current bar running parallel to the first current bar to conduct a direct current,
   the first current bar and the second current bar lying essentially in a plane and the faces of the power phase modules being arranged next to one another and parallel to this plane, the first DC terminal pair (of each power phase module being connected to the first current bar and to the second current bar through its connection elements.

13. The converter according to claim 11, further comprising:
   a connector pair with a first connector and a second connector,
   the first connector and the second connector lying essentially in a plane and the faces of the power phase modules being arranged next to one another and parallel to the plane, the first DC capacitor terminal pair of each power phase module being connected to the first connector and to the second connector through its connection elements.

14. The converter according to claim 13, wherein the first DC terminal pairs of adjacent power phase modules together with the first current bar pair form a high-inductance, low-resistance parallel connection between adjacent intermediate circuit capacitor modules, and wherein a connector pair forms a low-inductance, high-resistance parallel connection between adjacent intermediate circuit capacitor modules.

15. A vehicle with an energy converter of claim 11 for converting electrical energy into kinetic energy, or vice versa, wherein at least one AC terminal of a power phase module is connected with the energy converter.

* * * * *

UNITED STATES PATENT AND TRADEMARK OFFICE
CERTIFICATE OF CORRECTION

| | |
|---|---|
| PATENT NO. | : 11,452,227 B2 |
| APPLICATION NO. | : 16/617603 |
| DATED | : September 20, 2022 |
| INVENTOR(S) | : Roland Schmid et al. |

It is certified that error appears in the above-identified patent and that said Letters Patent is hereby corrected as shown below:

In the Claims

Column 23, Line 51, Claim 2, delete "each the" and insert -- each of the --

Column 23, Line 56, Claim 3, delete "each the" and insert -- each of the --

Column 24, Line 45, Claim 12, delete "(of" and insert -- of --

Signed and Sealed this
Sixth Day of December, 2022

*Katherine Kelly Vidal*
Katherine Kelly Vidal
*Director of the United States Patent and Trademark Office*